United States Patent [19]
Mizouchi

[11] Patent Number: 5,946,138
[45] Date of Patent: Aug. 31, 1999

[54] ILLUMINATION OPTICAL SYSTEM, EXPOSURE DEVICE AND DEVICE MANUFACTURING METHOD

[75] Inventor: Satoru Mizouchi, Utsunomiya, Japan

[73] Assignee: Canon Kabushiki Kaisha, Tokyo, Japan

[21] Appl. No.: 08/885,814

[22] Filed: Jun. 30, 1997

[30] Foreign Application Priority Data

Jul. 9, 1996 [JP] Japan ..................... 8-179076

[51] Int. Cl.⁶ .................................. G02B 27/10
[52] U.S. Cl. .................. 359/618; 359/619; 359/628; 362/259; 362/268; 355/67
[58] Field of Search .................. 359/618, 619, 359/628; 362/259, 268; 355/67

[56] References Cited

U.S. PATENT DOCUMENTS

| | | | |
|---|---|---|---|
| 4,769,750 | 9/1988 | Matsumoto et al. | 362/268 |
| 5,253,110 | 10/1993 | Ichihara et al. | 359/619 |
| 5,363,170 | 11/1994 | Muraki | 355/67 |
| 5,463,497 | 10/1995 | Muraki et al. | 359/618 |
| 5,594,526 | 1/1997 | Mori et al. | 355/67 |
| 5,594,587 | 1/1997 | Komatsuda et al. | 359/619 |
| 5,610,763 | 3/1997 | Kudo | 359/619 |
| 5,644,390 | 7/1997 | Yasuzato | 359/619 |

*Primary Examiner*—Loha Ben
*Attorney, Agent, or Firm*—Fitzpatrick, Cella, Harper & Scinto

[57] ABSTRACT

An illumination optical system includes a light source which produces a light beam, the light beam having an anisotropic coherence, with a high coherence direction and a low coherence direction, and an optical integrator, which includes a plurality of lens elements upon which the light beam is incident. The plurality of lens elements each include an opening having a long direction and a short direction. The long direction of each of the plurality of lens elements is aligned with the high coherence direction of the light beam, and the short direction of each of the plurality of lens elements is aligned with the low coherence direction of the light beam.

16 Claims, 9 Drawing Sheets

ILLUMINATION OPTICAL SYSTEM, EXPOSURE DEVICE AND DEVICE MANUFACTURING METHOD

BACKGROUND OF THE INVENTION

1. Field of the Invention

The present invention relates to an illumination optical system, an exposure device for manufacturing semiconductor devices such as IC's, LSI's and the like, imaging devices such as CCD's, and devices such as magnetic heads, and a method of manufacturing a device using the exposure device.

2. Description of the Related Art

In manufacturing a semiconductor device using photolithographic technology, a projection exposure device is conventionally used for exposing a transfer pattern of a photo mask (mask) to transfer the pattern to a substrate such as a wafer or a glass plate on which a photoresist is coated (hereinafter referred to as a "substrate"), through a projection optical system. In recent years, improvements in integration and definition in semiconductor devices have required the projection exposure device to have a higher resolution.

In order to comply with this need for higher resolution, a laser such as an excimer laser, which generates a pulsed beam, is used as a light source in the far ultraviolet region for the projection exposure device.

On the other hand, when a mask is illuminated with a beam emitted from a coherent light source, such as an excimer laser or the like, nonuniformity occurs in an illumination distribution due to interference fringes, thereby adversely affecting exposure precision. In order to avoid this problem, conventionally, the position of a beam incident on an optical integrator such as a fly's eye lens is shifted, or a mask is exposed using a plurality of pulsed beams while the phase of the interference fringes is changed so as to prevent nonuniformity in the illumination distribution due to the interference fringes from adversely affecting exposure precision.

However, in the above-mentioned methods, when the beam incident position of the optical integrator is shifted by a member, for example, a vibrating mirror, the member for shifting the beam incident position and means for driving the member are required. This complicates the configuration of the apparatus.

SUMMARY OF THE INVENTION

Accordingly, an object of the present invention is to solve the above problems and to provide an illumination optical system which has a relatively simple structure and which is capable of uniformly illuminating an object.

In order to achieve the object, in accordance with one aspect of the present invention, there is provided an illumination optical system comprising an optical integrator upon which a beam having anisotropic coherence is incident, wherein the optical integrator comprises a plurality of lens elements which respectively form a plurality of secondary light sources, the distance between the respective secondary light sources in a direction of the incident beam having high coherence being longer than that in a direction of the incident beam having coherence lower than that of the beam incident in the high coherence direction.

In accordance with another aspect of the present invention, there is provided an illumination optical system comprising an optical integrator upon which a beam having anisotropic coherence is applied, wherein the optical integrator comprises a plurality of lens elements which respectively form a plurality of secondary light sources, and wherein each of the lens elements has an opening, the length of which in a direction of the incident beam having high coherence being longer than that in a direction of the incident beam having coherence lower than that of the beam incident in the high coherence direction.

In accordance with a further aspect of the present invention, an exposure device comprises a light source for supplying a beam having anisotropic coherence, and an illumination optical system in accordance with each of the above-noted aspects of the present invention.

In the present invention, the direction of the incident beam with high coherence is perpendicular to the direction of the incident beam having low coherence.

In accordance with a still further aspect of the present invention, a device manufacturing method comprises the steps of transferring a pattern formed in a mask by exposure to a substrate using an exposure device of the present invention, and developing the substrate.

DETAILED DESCRIPTION OF THE PREFERRED EMBODIMENTS

Figure 1:
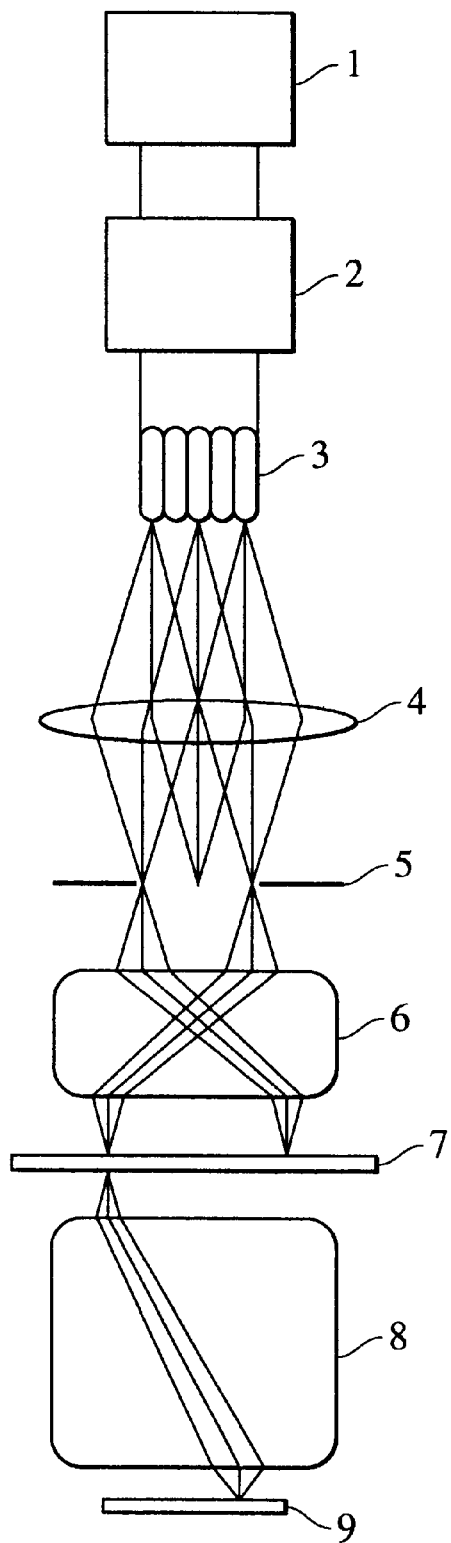
FIG. 1 is a schematic drawing illustrating a principal portion of a projection exposure device comprising an illumination optical system in accordance with a first embodiment of the present invention.

FIG. 1 is a schematic drawing illustrating a projection exposure device comprising an illumination optical system in accordance with a first embodiment of the present invention.

In FIG. 1, a beam having anisotropic coherence and emitted from a light source 1 such as an excimer laser is deformed into a desired shape by a beam shaping optical system 2, and then applied to a fly's eye lens 3, serving as an optical integrator, and a condenser lens 4. A plurality of images (secondary light sources) of the light source 1 are respectively formed in the vicinity of the emission surfaces of lens elements which constitute the fly's eye lens 3. The beams passing through the condenser lens 4 form an illumination region having a desired shape by means of a diaphragm 5, and are then applied to a substrate 9, on which a photosensitive material is coated, through an optical system 6, a mask 7 and a projection optical system 8. As a result, a pattern formed in the mask 7 is transferred to the substrate 9 by exposure. The diaphragm 5, the mask 7 and the substrate 9 are arranged at optically conjugate positions.

Figure 2:
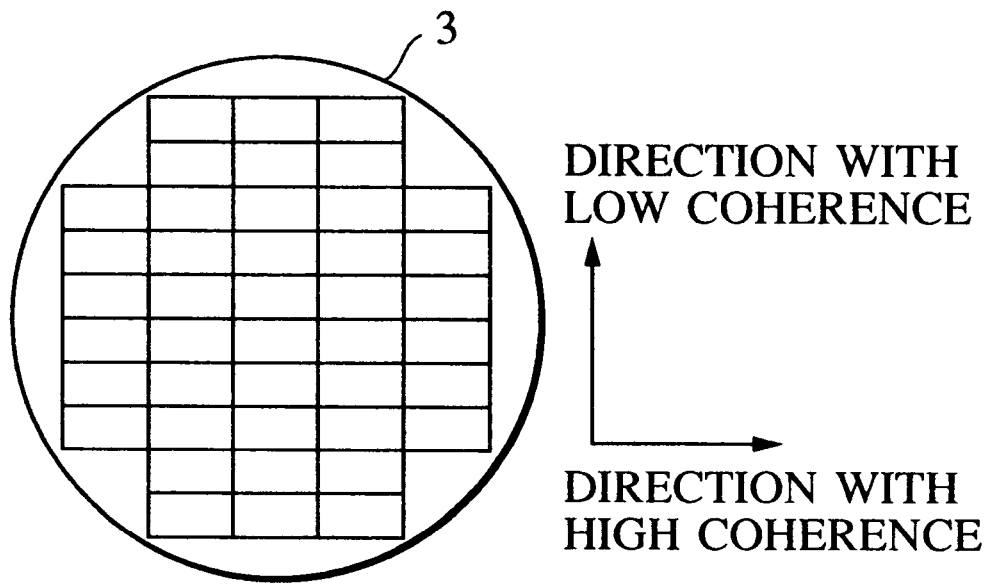
FIG. 2 is a drawing of a fly's eye lens in accordance with an embodiment of the present invention as viewed from the light source side.

FIG. 2 is a drawing illustrating the fly's eye lens 3 as viewed from the light source side.

Each of the lens elements which constitute the fly's eye lens 3 has a rectangular opening in which the side parallel to the direction of the incident beam with high coherence is longer than the side in the direction of the incident beam with low coherence, which is perpendicular to the direction with high coherence. The lengths of these sides depend upon coherence of the beam, and the size of the opening is determined to be a shape which can provide the most uniform illumination distribution on the basis of the results of simulation and actual measurement.

Herein, the terms "high coherence" and "low coherence" are relative expressions. Generally, the direction of the beam emitted from an excimer laser and having highest coherence is perpendicular to the direction with lowest coherence. In this embodiment, therefore, the direction of the beam with highest coherence is set in the lengthwide direction of an opening, and the direction of the beam with lowest coherence is set in the widthwise direction of the opening.

Figure 3:
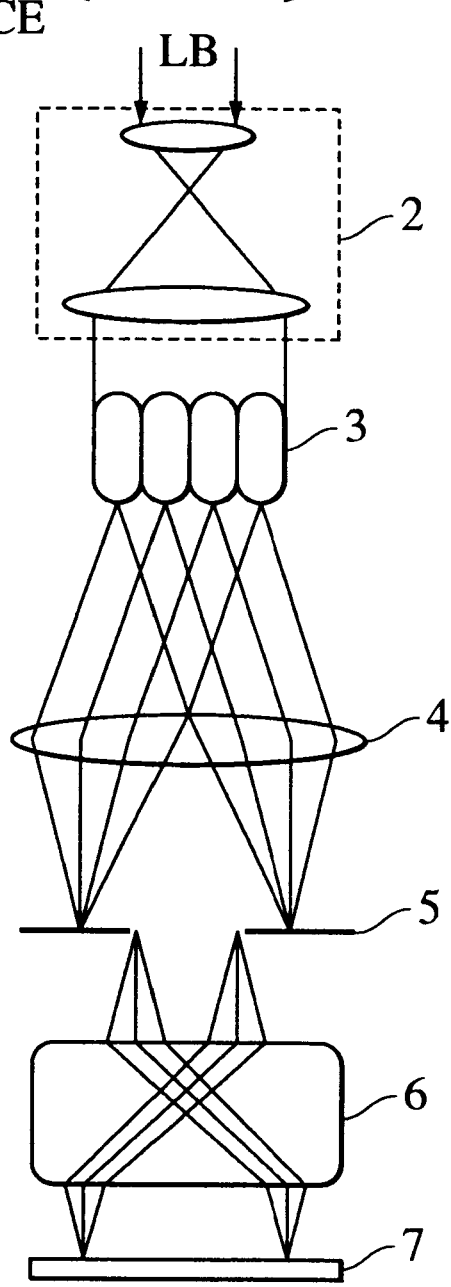
FIG. 3 is a sectional view illustrating details of a portion of the illumination optical system from a beam shaping optical system to a mask in the projection exposure device shown in FIG. 1, taken along a plane parallel to a direction of an incident beam with high coherence.
Figure 4:
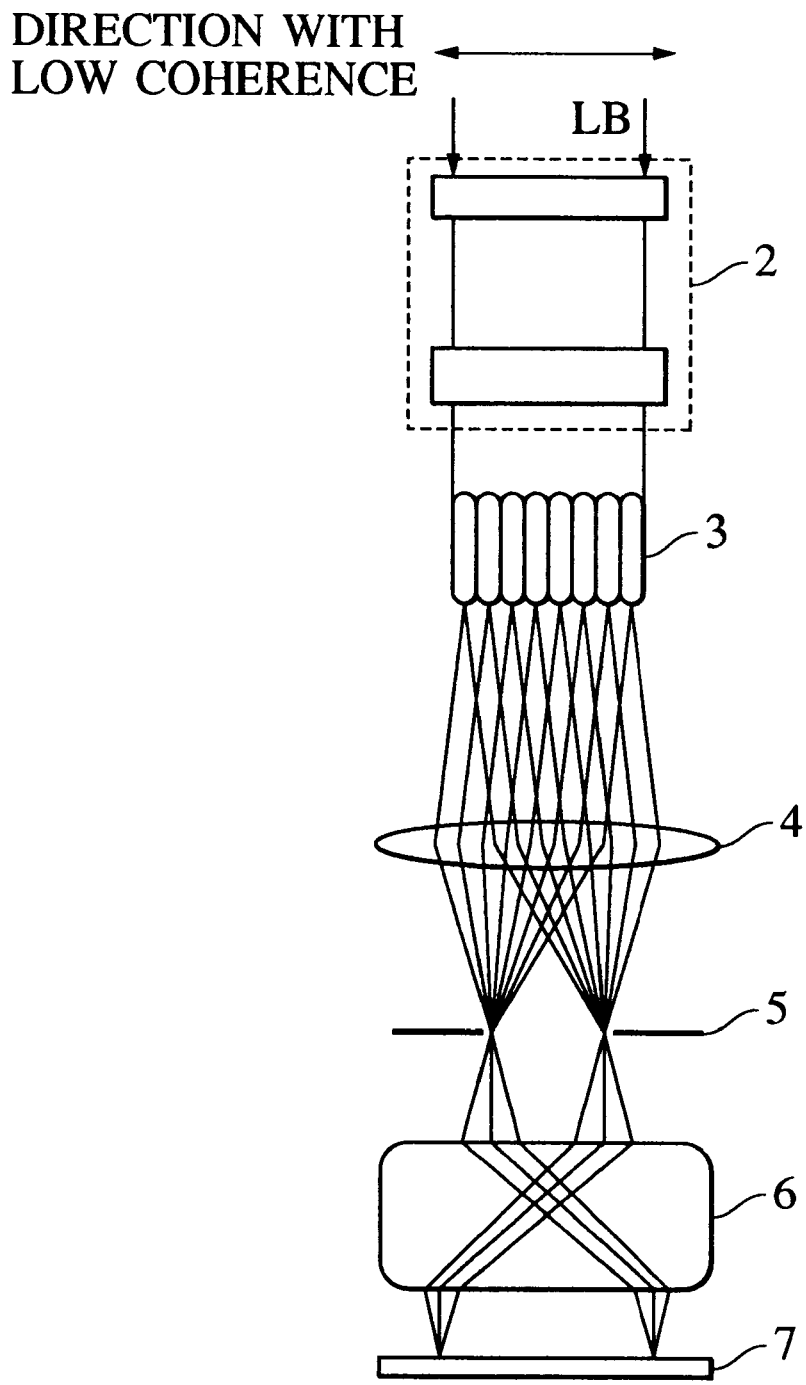
FIG. 4 is a sectional view illustrating details of a portion of the illumination optical system from the beam shaping optical system to the mask in the projection exposure device shown in FIG. 1, taken along a plane parallel to a direction of an incident beam with low coherence.

FIGS. 3 and 4 show details of a portion of the illumination optical system from the beam shaping optical system 2 to the mask 7 in this embodiment. FIG. 3 is a sectional view taken along a plane parallel to the direction of the incident beam with high coherence, and FIG. 4 is a sectional view taken along a plane parallel to the direction of the incident beam with low coherence.

Since the opening of each of the lens elements of the fly's eye lens 3 has different dimensions in the direction of the incident beam with high coherence and in the direction with low coherence, as described above, the beams emitted from each of the lens elements have different emission angles in the direction of the incident beam with high coherence and in the direction with low coherence, as shown in FIGS. 3 and 4. Accordingly, the beams which reach the surface of the diaphragm 5 through the condenser lens 4 have different illumination regions in both directions. However, the diaphragm 5 permits illumination of the mask 7 within an illumination region having a predetermined shape defined by the diaphragm 5.

Figure 5:
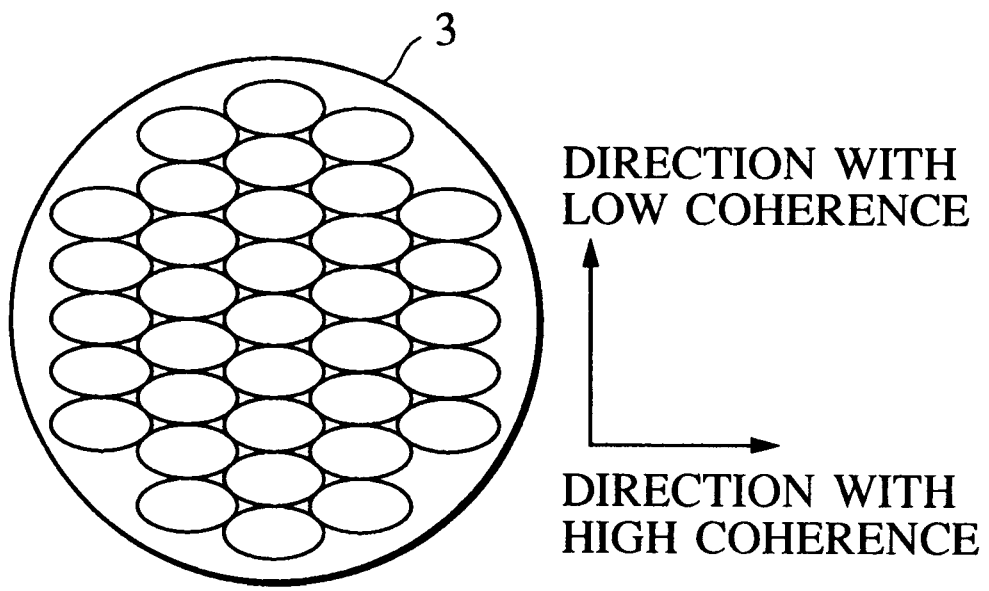
FIG. 5 is a drawing of a fly's eye lens in accordance with another embodiment of the present invention as viewed from the light source side.

FIG. 5 shows a fly's eye lens according to another embodiment of the present invention. In this embodiment, the opening of each of the lens elements has an elliptical shape having its long axis in the direction of the incident beam with high coherence and its short axis in the direction of the incident beam with low coherence. Even when the opening of each lens element has a shape other than the shapes shown in FIGS. 2 and 5, the effects of the present invention can be expected, as long as the opening has a shape in which the length in the direction of the incident beam with high coherence is larger than that in the direction of the incident beam with low coherence.

In the present invention, therefore, the length of the openings of each of the lens elements in the fly's eye lens in the direction of the incident beam with high coherence is larger than that in the direction of the incident beam with low coherence, so that spatial coherency in the direction with high coherence is decreased. Thereby, the mask 7 is uniformly illuminated.

Figure 6:
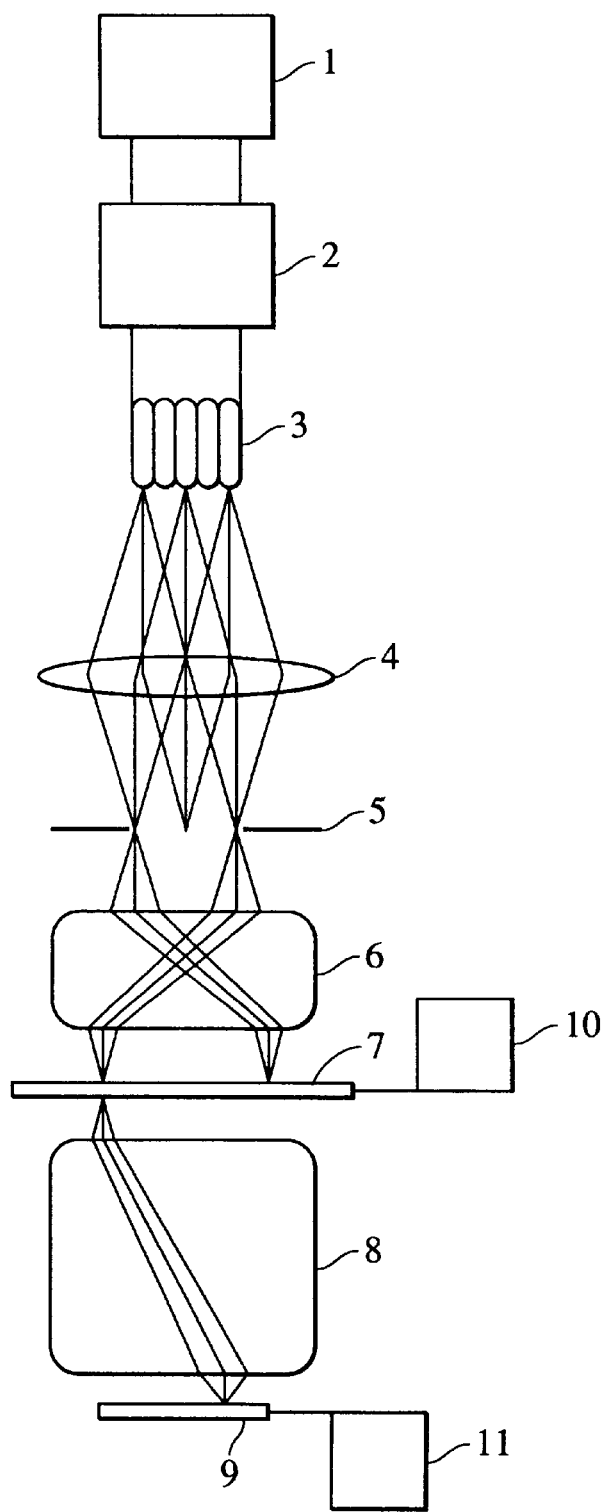
FIG. 6 is a schematic drawing illustrating a principal portion of a scanning exposure device comprising an illumination optical system in accordance with a second embodiment of the present invention.

FIG. 6 is a schematic drawing illustrating a principal portion of a scanning exposure device in accordance with another embodiment of the present invention.

This embodiment is different from the above embodiment in that this embodiment further comprises mask scanning means 10 and substrate scanning means 11 for synchronously scanning the mask 7 and the substrate 9, respectively. The incident openings of the lens elements of the fly's eye lens 3 are arranged in a conjugate relationship with the mask 7.

Figure 7:
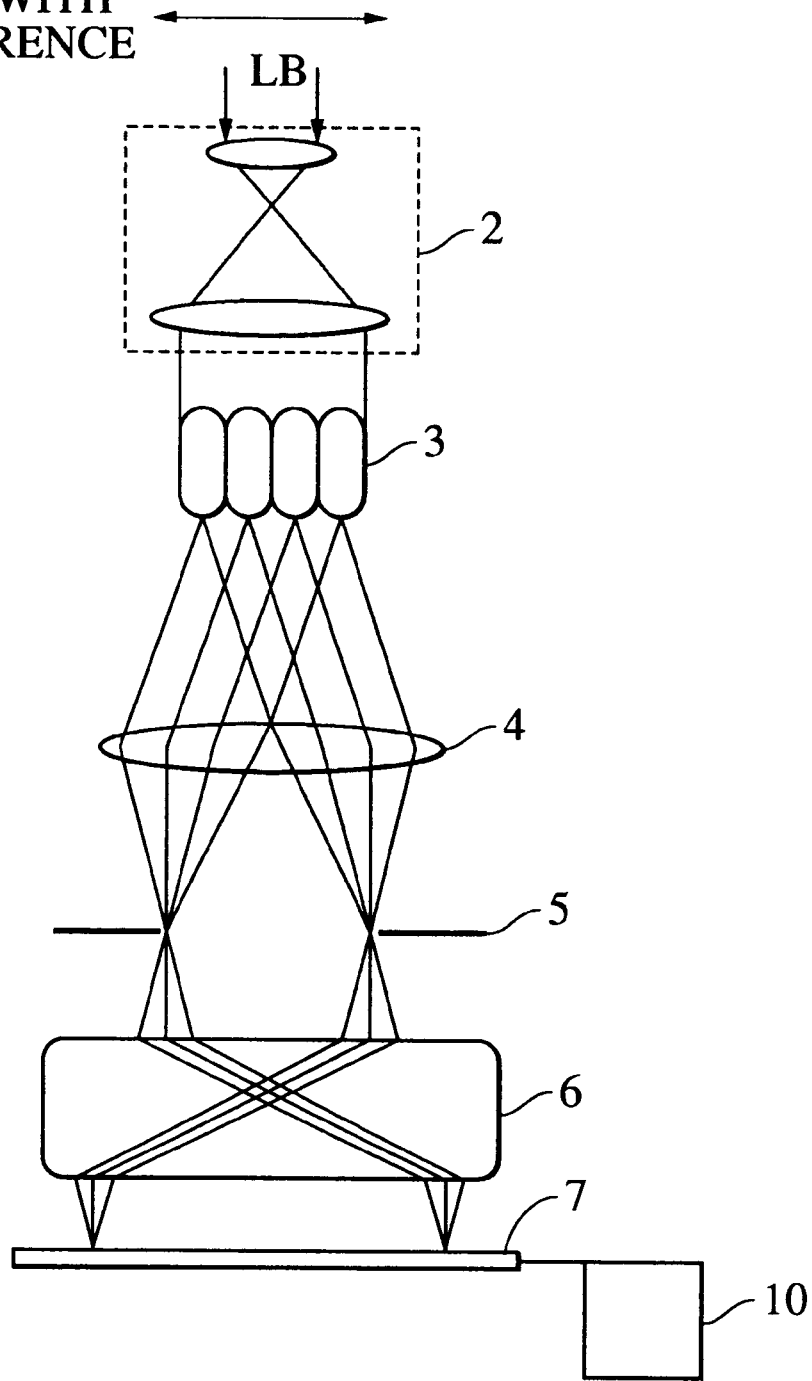
FIG. 7 is a sectional view illustrating details of a portion of the illumination optical system from a beam shaping optical system to a mask in the scanning exposure device shown in FIG. 6, taken along a plane parallel to a direction of an incident beam with high coherence.
Figure 8:
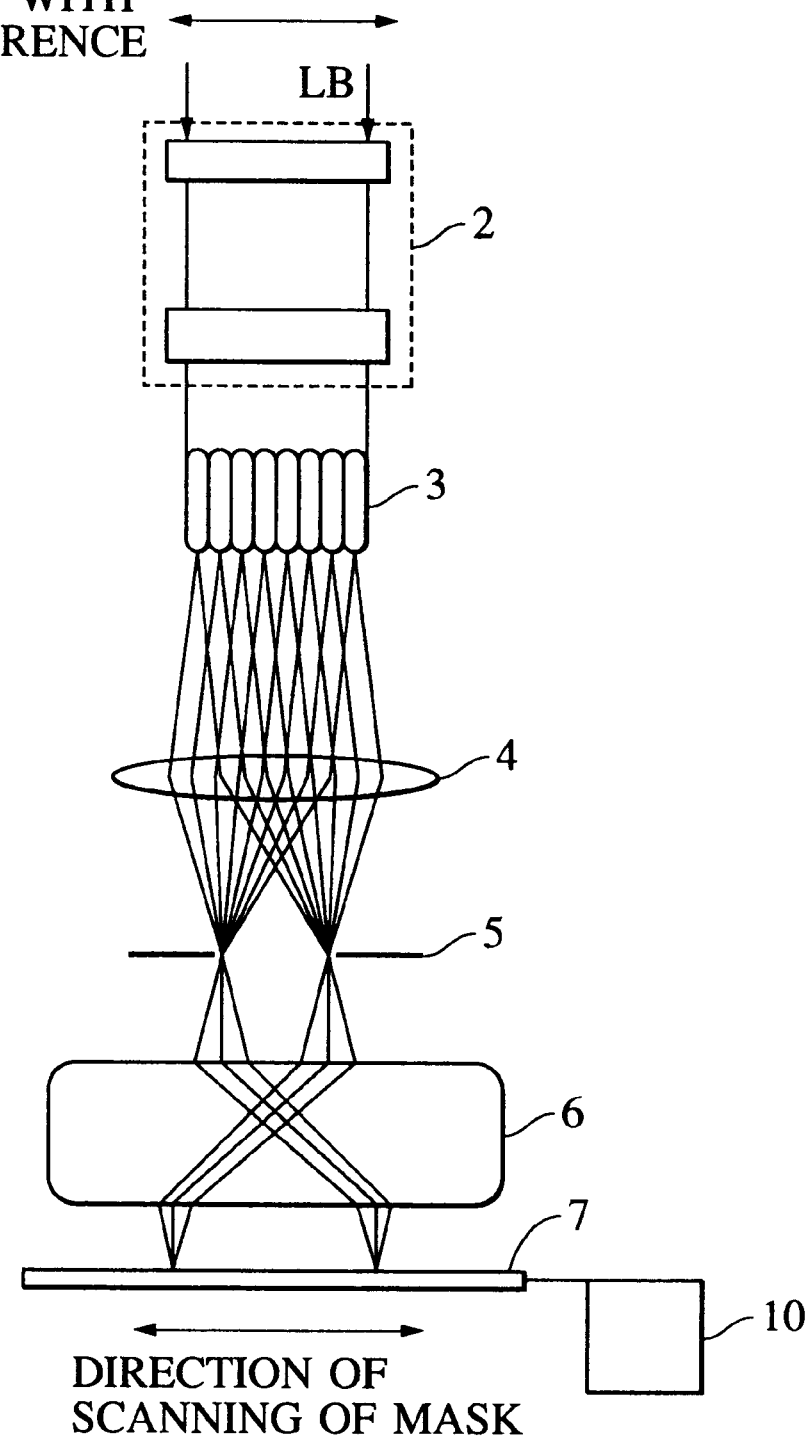
FIG. 8 is a sectional view illustrating details of a portion of the illumination optical system from the beam shaping optical system to the mask in the scanning exposure device shown in FIG. 6, taken along a plane parallel to a direction of an incident beam with low coherence.

FIGS. 7 and 8 show a portion of the illumination optical system from the beam shaping optical system and the mask 7 in this embodiment. FIG. 7 is a sectional view taken along a plane parallel to the direction of the incident beam with high coherence, and FIG. 8 is a sectional view taken along a plane parallel to the direction of the incident beam with low coherence.

In this embodiment, since the incident openings of the lens elements which constitute the fly's eye lens 3 are arranged at positions in a conjugate relationship with the mask 7 and thus, with the diaphragm 5, the shape of the beam projected on the surface of the diaphragm 5 is similar to the shape of the incident opening of each of the lens elements.

In this embodiment, by way of example, the opening of each of the lens elements has a shape similar to that in the first embodiment. When the openings of the lens elements have a rectangular shape, as shown in FIG. 2, the beam applied to the surface of the diaphragm 5 has a rectangular shape similar to the openings of the lens elements, as described above. Therefore, the scanning exposure device generally forms a rectangular illumination region in which the side in the scanning direction is shorter than the side in the non-scanning direction, so that exposure is carried out by synchronously scanning the mask 7 and the substrate 9 within an exposure region wider than the illumination region. In cases wherein the direction of the short side of the opening is parallel to the scanning direction of the mask 7 and the substrate 9, the amount of the beam cut off for forming the illumination region by the diaphragm 5 is decreased, thereby improving utilization of the light.

A method of manufacturing a semiconductor device by using the exposure device of the present invention will be described below.

Figure 9:
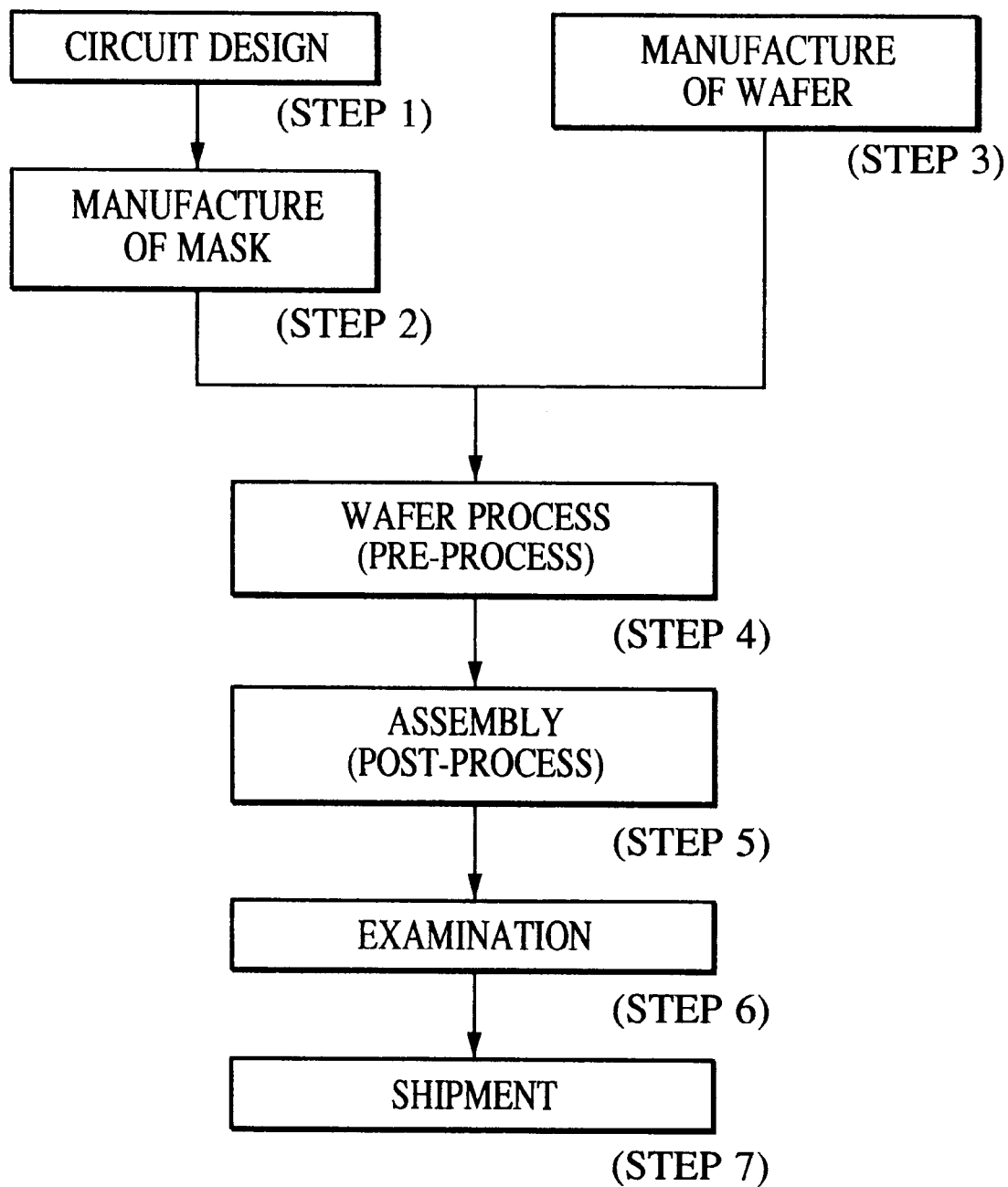
FIG. 9 is a drawing illustrating a process for manufacturing a semiconductor device.

FIG. 9 shows a flow chart of the manufacture of a semiconductor device (e.g., a semiconductor chip such as an IC, LSI, or the like, a liquid crystal panel or CCD). A circuit of a semiconductor device is designed in Step 1 (circuit design). A mask (e.g., the mask 7) having a designed circuit pattern formed therein is produced in Step 2 (production of the mask). On the other hand, a wafer (e.g., the substrate 9) is produced by using a material such as silicon or the like in Step 3 (production of wafer). An actual circuit is formed on the wafer by lithographic technology using the mask and wafer prepared in Step 4 (wafer process) which is referred to as a "pre-process". A chip is formed by using the wafer, which is formed in Step 4, in Step 5 (assembly) which is referred to as a "post-process" and which includes an assembly step (dicing and bonding) and a packaging step (chip packaging). The semiconductor device formed in Step 5 is tested with respect to confirmation of the operation, durability, etc., in Step 6 (examination). The semiconductor device is completed through these steps and then shipped (Step 7).

Figure 10:
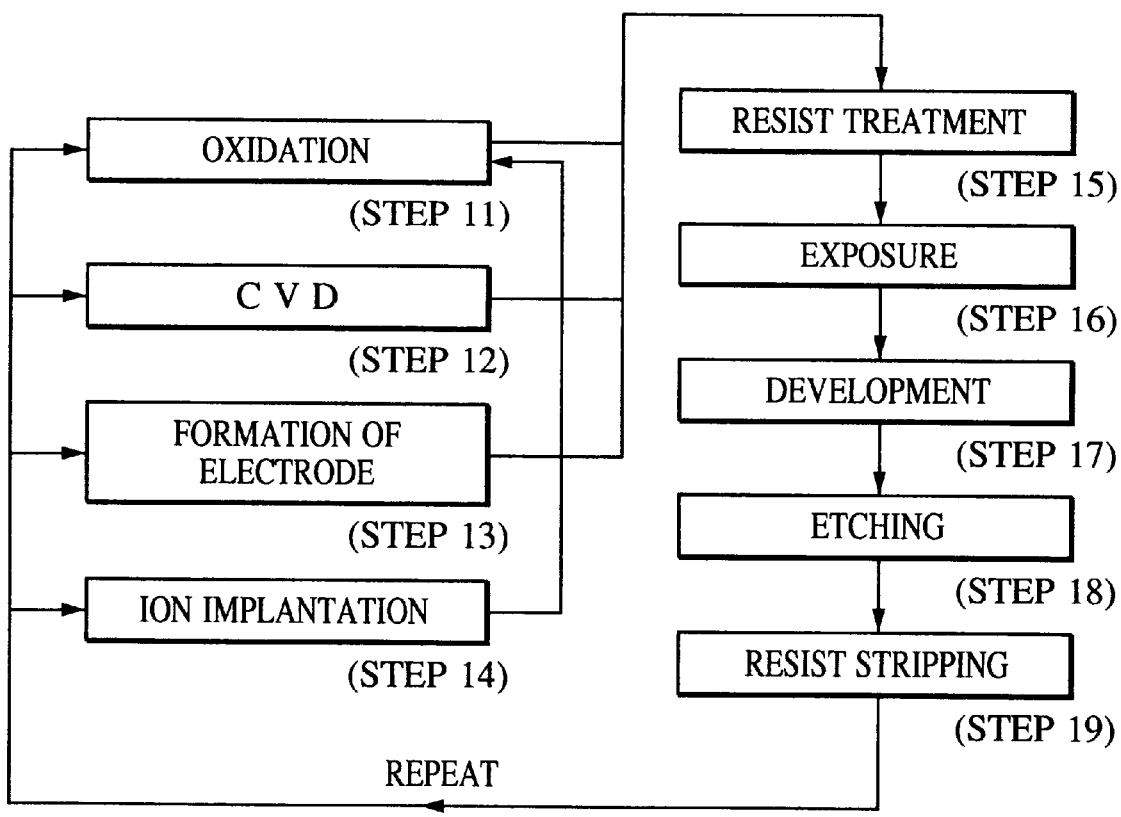
FIG. 10 is a drawing illustrating details of the wafer process in the process shown in FIG. 9.

FIG. 10 shows details of the flow chart of the wafer process of Step 4 shown in FIG. 9. The surface of the wafer (e.g., the substrate) is oxidized in Step 11 (oxidation). An insulating film is formed on the surface of the wafer in Step 12 (e.g., by chemical vapor deposition-CVD). An electrode is formed on the wafer by evaporation in Step 13 (electrode formation). Ions are implanted into the wafer in Step 14 (ion implantation), and a resist is coated on the wafer in Step 15 (resist treatment). The wafer is then exposed by the exposure device using a mask (e.g., the mask 7) having a circuit pattern image, in Step 16 (exposure). The exposed wafer is developed in Step 17 (development), and portions other than the developed resist are removed in Step 18 (etching). The unnecessary resist portions remaining after etching are removed in Step 19 (resist stripping). These steps are repeated to form a circuit pattern on the wafer.

The use of this manufacturing method provides the ability to manufacture a semiconductor device with a high degree of integration, which has been conventionally difficult to manufacture.

Except as otherwise disclosed herein, the various components shown in outline or block form in the Figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An illumination optical system comprising:

a light source which produces a light beam, the light beam having an anisotropic coherence, with a high coherence direction and a low coherence direction; and an optical integrator, comprising a plurality of lens elements, upon which the light beam is incident, wherein the plurality of lens elements each comprise an opening having a long direction and a short direction, the long direction of each of the plurality of lens elements being aligned with the high coherence direction of the light beam, and the short direction of each of the plurality of lens elements being aligned with the low coherence direction of the light beam.

2. An illumination optical system according to claim 1, wherein said light source comprises an excimer laser.

3. An illumination optical system according to claim 1, wherein the opening has a rectangular shape.

4. An illumination optical system according to claim 1, wherein the opening has an elliptical shape.

5. A method of manufacturing a semiconductor device, comprising the steps of:

producing, using a light source, a light beam having an anisotropic coherence, with a high coherence direction and a low coherence direction;

aligning an optical integrator with the light beam to reduce interference fringes, the optical integrator comprising a plurality of lens elements, each comprising an opening having a long direction and a short direction, the long direction of each of the plurality of lens elements being aligned with the high coherence direction of the light beam, and the short direction of each of the plurality of lens elements being aligned with the low coherence direction of the light beam; and transferring, by exposure using an exposure apparatus that includes the light source and the optical integrator, a pattern formed on a mask onto a substrate.

6. A method according to claim 5, wherein the light source comprises an excimer laser.

7. A method according to claim 5, wherein the opening has a rectangular shape.

8. A method according to claim 5, wherein the opening has an elliptical shape.

9. A method according to claim 5, further comprising developing the substrate.

10. A method according to claim 5, further comprising synchronously scanning the mask and the substrate in a scanning direction, wherein the scanning direction is the low coherence direction.

11. An exposure apparatus comprising:

a light source which produces a light beam, the light beam having an anisotropic coherence with a high coherence direction and a low coherence direction, substantially orthogonal to the high coherence direction;

an optical integrator, comprising a plurality of lens elements, upon which the light beam is incident, the lens elements respectively forming a plurality of secondary light sources, wherein a distance between each of the plurality of secondary light sources in the high coherence direction is longer than a distance between each of the plurality of secondary light sources in the low coherence direction; and a condenser lens for receiving light from the plurality of secondary light sources and for illuminating a pattern formed on a mask, to transfer the pattern on the mask onto a substrate by exposure.

12. An exposure apparatus according to claim 11, wherein the light source comprises an excimer laser.

13. An exposure apparatus according to claim 11, further comprising means for synchronously scanning the mask and the substrate in a scanning direction, wherein the scanning direction is the low coherence direction.

14. An exposure apparatus according to claim 11, wherein the plurality of lens elements each comprise an opening having a long direction and a short direction, the long direction of each of the plurality of lens elements being aligned with the high coherence direction of the light beam, and the short direction of each of the plurality of lens elements being aligned with the low coherence direction of the light beam.

15. An exposure apparatus according to claim 14, wherein the opening has a rectangular shape.

16. An exposure apparatus according to claim 14, wherein the opening has an elliptical shape.

* * * * *